United States Patent
Misra et al.

(10) Patent No.: US 10,096,557 B2
(45) Date of Patent: Oct. 9, 2018

(54) TILED-STRESS-ALLEVIATING PAD STRUCTURE

(71) Applicant: GLOBALFOUNDRIES INC., Grand Cayman (KY)

(72) Inventors: Ekta Misra, Carmel, NY (US); Mukta G. Farooq, Hopewell Junction, NY (US); Krishna Tunga, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/791,568

(22) Filed: Oct. 24, 2017

(65) Prior Publication Data
US 2018/0061777 A1 Mar. 1, 2018

Related U.S. Application Data

(62) Division of application No. 15/176,595, filed on Jun. 8, 2016, now Pat. No. 9,842,810.

(51) Int. Cl.
| | |
|---|---|
| *H01L 23/00* | (2006.01) |
| *H01L 23/31* | (2006.01) |
| *H01L 23/528* | (2006.01) |
| *H01L 21/3205* | (2006.01) |

(52) U.S. Cl.
CPC ...... *H01L 23/562* (2013.01); *H01L 21/32051* (2013.01); *H01L 23/3171* (2013.01); *H01L 23/5283* (2013.01)

(58) Field of Classification Search
CPC ............ H01L 23/562; H01L 21/32051
See application file for complete search history.

(56) References Cited

U.S. PATENT DOCUMENTS

| | | | |
|---|---|---|---|
| 7,375,021 B2 | 5/2008 | Edelstein et al. | |
| 2010/0283148 A1* | 11/2010 | Tsai | H01L 24/13 257/737 |
| 2016/0315055 A1* | 10/2016 | Vogt | H01L 25/50 |

* cited by examiner

*Primary Examiner* — Moazzam Hossain
*Assistant Examiner* — Farun Lu
(74) *Attorney, Agent, or Firm* — Scully Scott Murphy and Presser; Frank Digiglio

(57) ABSTRACT

Structure and method for reducing thermal-mechanical stresses generated for a semiconductor device are provided, which includes a tiled-stress-alleviating pad structure.

10 Claims, 5 Drawing Sheets

TILED-STRESS-ALLEVIATING PAD STRUCTURE

BACKGROUND

The application relates to semiconductor devices and to methods for fabricating semiconductor devices, and more particularly to a method and structure for fabricating a tiled-stress-alleviating pad structure for use, for instance, in back-end-of line (BEOL) and/or far back end of line (FBEOL) semiconductor structures.

As the density of circuits, such as multi-core or application-specific integrated circuits (ASICs), continues to increase, many designers are working towards three-dimensional (3-D) stacked chip technology as an emerging trend in the industry. By way of example, during conventional far back end of the line (FBEOL) processing of 3-D stacked chip fabrication, metal pad layers are traditionally employed to support a controlled collapse chip connection (C4) element and the corresponding ball limiting metallurgy (BLM) layers. Disadvantageously, these pad layers which, for instance, may include, or be fabricated of, aluminum or aluminum alloy, may have a higher coefficient of thermal expansion (CTE) compared to other components of the 3-D stacked die. This CTE mismatch may result in significant thermal-mechanical stresses being generated in the metal pad layer and other layers of the 3D-stacked die during the subsequent processing steps, resulting in undesirable delamination and/or cracking of the pad layer which, in turn, may impact yield, and thereby increase costs.

BRIEF SUMMARY

Certain shortcomings of the prior art are overcome and additional advantages are provided through the provision, in one aspect, of a method for fabricating a semiconductor device which includes, for instance, providing a pad layer in contact with and over a last level of an integrated circuit having a dielectric layer and a metal wiring, the last level is located on a substrate structure; and patterning the pad layer to provide a tiled-stress-alleviating pad structure over the metal wiring of the last level, where the tiled-stress-alleviating pad structure includes a plurality of tiles, each tile of the tiled-stress-alleviating pad structure has a set geometry, and is at a set distance from immediately adjacent tiles of the tiled-stress-alleviating pad structure.

In a further aspect, a semiconductor device which includes, for instance, a tiled stress-alleviating pad structure in contact with a last level of an integrated circuit having a dielectric layer and a metal wiring, the last level being located on a substrate structure, where the tiled-stress-alleviating pad structure includes a plurality of tiles, the plurality of the tiles of the tiled-stress-alleviating pad structure having a set geometry, and a set distance between immediately adjacent tiles, and are uniformly spaced apart from each other by a set distance.

BRIEF DESCRIPTION OF THE SEVERAL VIEWS OF THE DRAWINGS

One or more aspects of the application are particularly pointed out and distinctly claimed as examples in the claims at the conclusion of the specification. The foregoing and other objects, features, and advantages of the application are apparent from the following detailed description taken in conjunction with the accompanying drawings in which:

DETAILED DESCRIPTION

Figure 1A:
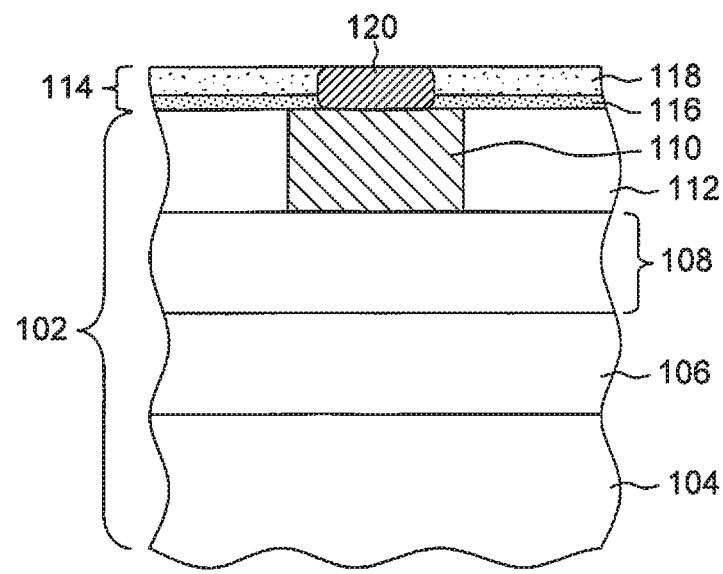
FIG. 1A is a cross-sectional view of a structure obtained during semiconductor device fabrication, and includes a last level of an integrated circuit having a dielectric layer and a metal wiring disposed over a substrate structure, in accordance with one or more aspects of the application.

Aspects of the application and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the application in details. It should be understood, however, that the detailed description and the specific examples, while indicating embodiments of the application, are given by way of illustration only, and not by way of limitation. Various substitutions, modifications, additions and/or arrangements within the spirit and/or scope of the underlying inventive concepts will be apparent to those skilled in the art from this disclosure.

The application provides, in part, a structure and method for minimizing thermal-mechanical stresses of an integrated circuit. In preferred embodiments, the structure may be used in conjunction within various components of a 3-D stacked die using, for instance, a tiled-stress-alleviating pad structure disposed over a last level of an integrated circuit having a dielectric layer and a metal wiring of a substrate structure. As one skilled in the art will understand, these thermal-mechanical stresses are typically generated, for instance, during the subsequent wafer finishing operations of semiconductor device fabrication. In one aspect, and during conventional wafer finishing and assembly process, controlled collapsed chip connections (C4 connections) have been used to bond a chip to a chip carrier, and metal pad layers are traditionally employed to support solder bumps used in C4 connections and to simultaneously form additional metal features for providing electrical access to on-chip devices. By way of an example, one or more dielectric layers are typically formed over the substrate structure, which are subsequently patterned, etched and metallized to form multiple back-end-of line (BEOL) levels of metal wires and vias. A through-silicon via (TSV) structure could be formed at one of the BEOL levels. Further, as one skilled in the art will understand, the far-back-end of line (FBEOL) level may include a metal wiring formed within the dielectric layer of the last level of the integrated circuit, and a metal pad layer which, for instance, may include, or be fabricated of, a metal such as, aluminum or aluminum alloy pad layer is formed over the metal wiring disposed within the dielectric layer of the last level of the integrated circuit. A passivation layer having a via opening may subsequently be formed over the metal pad layer, followed by the formation of one or more BLM layers. A solder ball may subsequently be disposed over the BLM layers. As understood, the pad layer facilitates supporting the BLM layer(s) over which the solder ball of the C4 configuration resides. Disadvantageously, the increasing density of semiconductor integrated circuits and the varying coefficients of thermal coefficient of expansion (CTE) of the various components within the BEOL, TSV and FBEOL levels of the 3-D stacked die could lead to significant stresses (for example, peeling stress and/or cracking stress) developing within various layers of the stacked die including the aluminum or aluminum alloy pad layer. These thermal-mechanical stresses, owing to the CTE mismatch, could result in undesirable mechanical failures within the semiconductor devices, such as, cracking and/or delamination of the metal pad layer. Further, these mechanical failures initiated at the metal pad layer could either propagate through the underlying BEOL layers resulting in cohesive or adhesive failure of the weaker BEOL dielectric layers or through the overlying BLM layers and the solder ball causing them to crack, which may further impact yield, and thereby increase costs.

In one aspect of the application, there is disclosed a method for alleviating thermal-mechanical stresses developed within the 3D-stacked die which includes, for instance, providing a pad layer in contact with, and over a last level of an integrated circuit having a dielectric layer and a metal wiring, the last level being located on a substrate structure; and patterning the pad layer to provide a tiled-stress-alleviating pad structure over the metal wiring of the last level, where the tiled-stress-alleviating pad structure includes a plurality of tiles, with each tile of the tiled-stress-alleviating pad structure having the set geometry, and is at a set distance from immediately adjacent tiles of the tiled-stress-alleviating pad structure.

In one embodiment, the tiled-stress-alleviating pad structure has an area that may be substantially similar, or equal, to an area of the pad layer, and where each tile of the tiled-stress-alleviating pad structure has an area that may be substantially less than the area of the pad layer. For instance, the area of each tile may be within a range from about 3,000 $nm^2$ to about 30,000 $nm^2$. Further, each tile of the tiled-stress-alleviating pad structure may be uniformly spaced apart at the set distance which can range from 1,500 nm to about 2,000 nm. In one implementation, the set geometry of the pad layer may include at least one of a circle and a polygon, and where each tile of the tiled-stress-alleviating pad structure is patterned to be arrayed in at least one configuration based on the set geometry of the pad layer. By way of an example, the set geometry of the pad layer may include a hexagonal-shaped pad layer, and the tiles of the tiled-stress-alleviating pad structure are patterned to be arrayed in a honeycomb pattern over the metal wiring of the last level. In another example, the set geometry of the pad layer may include the circular-shaped pad layer, and the tiles of the tiled-stress-alleviating pad structure are patterned to be arrayed in at least one of a 2×2 and an n×n array over the metal wiring of the last level. Still further, the tiled-stress-alleviating pad structure may include a first set of tiles and a second set of tiles, with the first set of tiles overlying the metal wiring, and the second set of tiles extending laterally over the dielectric layer of the last level. In this example, the second set of tiles extending laterally over the dielectric layer may be less than the first set of tiles overlying the metal wiring.

Further, the fabrication method may include a passivating layer having a via and multiple BLM layers disposed over the tiled-stress-alleviating pad structure, where each of the tiles of the tiled-stress-alleviating pad structure is in a spaced relation from the via and the one or more BLM layers. In one example, the at least one configuration may include a circular-shaped pad, and each tile of the tiled-stress-alleviating pad structure may be arrayed within the dielectric layer of the last level, or on the dielectric layer of the last level. In this example, the tiled-stress-alleviating pad structure is centered within the via and the one or more BLM layers disposed over the tiled-stress-alleviating pad structure.

In yet another embodiment, a semiconductor device may include a tiled-stress-alleviating pad structure in contact with a last level of an integrated circuit having a dielectric layer and a metal wiring, with the last level being located on a substrate structure, where the tiled-stress-alleviating pad structure may include a plurality of tiles, the plurality of the tiles of the tiled-stress-alleviating pad structure having a set geometry, and a set distance between immediately adjacent tiles, and are uniformly spaced apart from each other by a set distance.

Reference is made below to the drawings, which are not drawn to scale for ease of understanding, wherein the same reference numbers used throughout different figures designate the same or similar components.

By way of example, FIGS. 1A-1D depict one embodiment of a method and a structure for fabricating a tiled-stress-alleviating pad structure for use in far back end of line (FBEOL) semiconductor structures, in accordance with one or more aspects of the application. Advantageously, as described below, the tiled-stress-alleviating pad structure which, for instance, includes a plurality of tiles over the last level of an integrated circuit having a dielectric layer and a metal wiring disposed over the substrate structure, facilitates minimizing the thermal-mechanical stresses emanating from the overlying BLM layers and the underlying BEOL levels and TSV structures.

Beginning with FIG. 1A, a partial, cross-sectional view of one embodiment of a structure 100 which includes a substrate structure 102 is depicted. The substrate structure 102 includes, a substrate 104 which may be (in one example) a bulk semiconductor material such as, a bulk silicon wafer. In another example, the substrate 104 may be any silicon-containing substrate including, but not limited to, silicon (Si), single crystal silicon (Si), polycrystalline Si, amorphous Si or the like. Although not depicted in the figures, substrate 104 may further include a layered semiconductor structure such as, for example, silicon-on-nothing (SON), silicon-on-insulator (SOI), silicon germanium-on-insulator (SiGeOI), germanium-on-insulator (GOI), silicon-on replacement insulator (SRI) or the like. Substrate 104 may in addition or instead include various isolation structures or regions, nanowire structures, dopant regions and/or device features.

During front-end of line (FEOL) processing, substrate structure 102 may include individual devices which can be created in a device layer 106. By way of an example, these individual devices may include, for example, metal-oxide-semiconductor field-effect transistors (MOSFETs) such as, FINFETs, as well as capacitors, resistors, and other semiconductor devices. For instance, these devices may be formed using various techniques, and their formation may include several steps of processing such as, creating surface structures, isolation devices with shallow or deep trenches, forming n-type and p-type wells, providing gate structures, and fabricating source and drain conductive contact structures. Through these techniques, individual, unconnected (or at least partially connected) semiconductor devices may be fabricated in device layer 106.

After FEOL processing, as well as middle-of the line (MOL) processing, back end-of the line (BEOL) processing is performed. By way of example, the BEOL processing of substrate structure 102 may include, for instance, deposition of pre-metal dielectric (PMD) layer, and formation of metallized wires and vias in the PMD layer. During BEOL processing, a layer of dielectric material 108 may be deposited and patterned and metallized (not shown) into a network of interconnecting lines or wiring, for instance, to facilitate the desired interconnection of semiconductor devices in device layer 106 as required to implement an integrated circuit design. The deposition of dielectric layer 108 followed by subsequent processing, including, for instance, patterning, removing and filling of the trenches or vias with conductive material to form metal wires and vias, may be repeated during BEOL processing such that several metal layers, for example, between six and ten metal layers, are deposited and processed in a similar manner. Between each metal layer, interlayer dielectrics (ILD) may be formed to isolate signals from the various metal layers and to support structural integrity of the integrated circuit structure, including the metal layers and the interconnecting conductive structures such as TSV structures. By way of example, the ILD material may include, a material such as a medium-k dielectric material (where k, the dielectric constant value, is in the range of about 3.0 to about 6.0), a low-k dielectric material (where k, the dielectric constant value is less than 3.0) or an ultra-low k dielectric material (where k, the dielectric constant value is less than 2.3). Further, as one skilled in the art will understand, the TSV structures may be provided within the various BEOL/MOL levels 108, FEOL level 106 and substrate 104 layers.

Continuing with FIG. 1A, during the terminal BEOL metal layer processing, interlayer dielectric layer 112 may be deposited over the patterned and metallized BEOL layers 108 of the substrate structure 102. By way of an example, interlayer dielectric layer 112 which, for instance, may include, or be fabricated of, fluorinated tetraethoxysilane (TEOS) or silicon oxide or the like, may be patterned with one or more trenches or vias using one or more suitable lithography processes. Following patterning, material removal may be performed by, for example, any suitable etching process, such as, an anisotropic dry etching process, for instance, reactive ion etching (RIE) using sulfur hexafluoride ($SF_6$). One or more trenches or vias may subsequently be formed within the interlayer dielectric layer 112 followed by depositing a conductive material within the trench or via.

One or more metallization steps may subsequently be performed to provide a conductive structure within the trench or via. By way of example, the conductive structure may include one or more liners deposited within the via or trench, using any suitable deposition processing techniques, such as, atomic layer deposition (ALD), chemical vapor deposition (CVD) or metal-organic-CVD (MOCVD) or the like. For instance, these liners may include one or more conformally-deposited layers such as, for example, titanium, carbon-doped titanium, tungsten, tungsten nitride (WN), titanium nitride (TiN), tantalum nitride (TaN) or the like. A conductive material may subsequently be deposited over the liners using any suitable deposition processing techniques, such as, atomic layer deposition (ALD), chemical vapor deposition (CVD) or metal-organic-CVD (MOCVD), electroplating techniques or the like, and chemical-mechanical polishing (CMP) may be employed to polish away excess conductive material, resulting in the metallized trench or wiring structure 110 within the interlayer dielectric layer 112.

Continuing further with FIG. 1A, last level may be disposed over the terminal BEOL metallized trench or wiring structure 110 of substrate structure 102. By way of example, the last level 114 including a cap layer 116 and an oxide/nitride layer 118 disposed over cap layer 116. Cap layer 116, having a thickness from about 50 nm to about 1000 nm, and ranges therebetween, and may include, or be fabricated of, a doped or undoped-hydrogenated semiconductor material, such as, for example, nitrogen doped-hydrogenated silicon carbide material. Although not depicted, nitride layer which, for instance, may be, or may include, a silicon nitride material, may optionally be deposited using any suitable deposition techniques such as, for instance, a plasma-enhanced chemical vapor deposition (PECVD) process. In one example, the oxide/nitride layer 118 may include, or be fabricated of, materials such as, for example, mesoporous organosilicate glass (OSG), silicon-carbon-oxygen-hydrogen (SiCOH) organic dielectric materials, and may be deposited by employing, for instance, a conventional silane deposition process. Oxide/nitride layer 118, for instance, may have a thickness from about 100 nm to about 20000 nm, and ranges therebetween. The last level dielectric layer 114 may be formed using a variety of different materials and fabrication techniques, such as chemical vapor deposition (CVD), atomic layer deposition (ALD), physical vapor deposition (PVD) or plasma-enhanced versions of such processes. The thickness of the last level may also vary, depending upon the particular application.

One or more lithographic processing techniques may be performed to pattern an opening (not shown) within last level dielectric layer 114 which, for instance, extends to the underlying BEOL metallized trench or wiring structure 110 of the substrate structure 102. Although not depicted, one skilled in the art will understand that these lithographic processing steps may include (for instance) providing a photoresist layer over the last level dielectric layer 114 and subsequently patterning, using one or more conventional lithographic methods. For instance, the patterning process may proceed by transferring the pattern from a patterned photoresist layer to etch through the last level dielectric layer 114, thereby creating an opening (not shown) within the last level dielectric layer 114. Following patterning, material removal may be performed by, for example, any suitable etching process, such as, an anisotropic dry etching process, for instance, reactive ion etching (RIE) using sulfur hexafluoride ($SF_6$) to expose the underlying wiring or trench structure 110 of the substrate structure. The opening is then metallized by providing a conductive material within the opening using suitable deposition techniques, such as, atomic layer deposition (ALD), chemical vapor deposition (CVD) or metal-organic CVD (MOCVD) or by electroplating techniques or the like, and chemical-mechanical polishing (CMP) may be employed to polish away excess conductive material. The metal wiring of the opening is labeled as element 120 in the drawings.

Figure 1B:
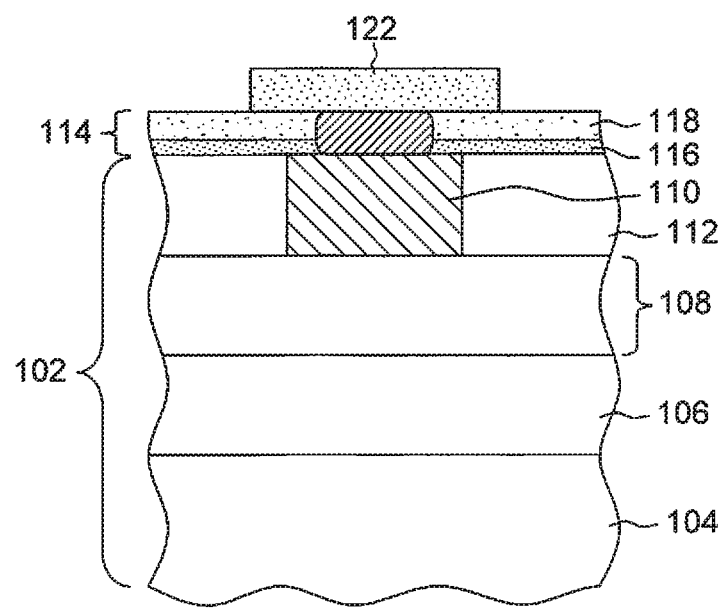
FIG. 1B depicts the structure of FIG. 1A with a pad layer provided over the last level of the integrated circuit, in accordance with one or more aspects of the application.

Referring to FIG. 1B, pad layer 122 may be deposited over the metal wiring 120 (see FIG. 1A) and the dielectric layer 114 of the last level. Pad layer 122 may have a thickness within a range from about 250 nm to about 3000 nm, and may be electrically connected to the BEOL wiring or trench structure 110 and the other BEOL metal layers 108. Further, depending upon the desired technology nodes at which the semiconductor device is fabricated, the pad layer may have an area "S" that may be sufficient to cover the entirety of the metal wiring 120, and extend at least partially laterally over the adjacent last level dielectric layer 114. In one example, the pad layer may have an average area of about 45000 $nm^2$. Further, the pad layer may have one or more geometries, such as, for example, a circular-shaped pad layer, a polygon-shaped pad layer (e.g., hexagonal-shaped or an octagonal-shaped) pad layer, depending upon the desired circuit design. By way of an example, the pad layer 122 may be conductive and may include, or be fabricated of, a metal such as, for instance, aluminum, copper, silver, gold, nickel, tungsten or alloys thereof, and may be deposited using any suitable conventional deposition techniques such as, chemical vapor deposition (CVD), atomic layer deposition (ALD), molecular beam deposition, metallorgano chemical vapor deposition (MOCVD), or plasma-enhanced versions of such processes. Standard lithographic processing techniques and substractive etching process may subsequently be employed to form the pad layer 122 over the last level. The upper surface of the pad layer 122 is exposed to subsequent fabrication processing, and the pad layer 122 may have an interfacial peeling stress at an interface of the pad layer and the last level. The value of the interfacial peeling stress may be calculated, for instance, by an averaging method using the material properties of the material surrounding the pad layer, the size of the chip or substrate or the like. In one example, the pad layer 122 may have an interfacial peeling stress from about −375 MPa to about 16 MPa. Although not depicted in the figures, pad liner (not shown) which may facilitate inhibiting diffusion of the material from the underlying BEOL layer 110 into the pad layer 122, may optionally be deposited, prior to the deposition of the pad layer 122. The pad liner, for example, may include, or be fabricated of, a material such as, for example, titanium, titanium nitride, tantalum, tantalum nitride or the like, and may be deposited using any suitable conventional deposition techniques such as, for instance, ALD, CVD or the plasma-enhanced versions of such processes.

Figure 1C:
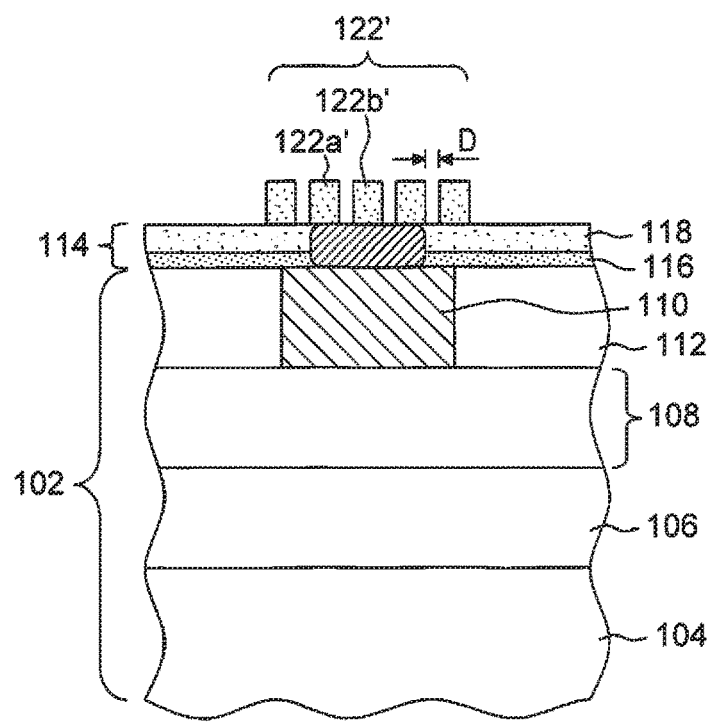
FIG. 1C depicts the structure of FIG. 1B after the pad layer has been patterned to provide a tiled-stress-alleviating pad structure, in accordance with one or more aspects of the application.

FIG. 1C depicts the structure of FIG. 1B after pad layer 122 (see FIG. 1B) has been patterned to provide tiled-stress-alleviating pad structure 122' over the last level, in accordance with one or more aspects of the present application. Although not depicted, one skilled in the art will understand that the patterning of the pad layer 122 may be accomplished by employing one or more suitable lithographic processes which may include providing a photoresist layer (not shown) over the pad layer 122 and subsequently patterning using one or more conventional lithographic methods. For instance, the patterning process may proceed by transferring the pattern from a patterned photoresist layer (not shown) to etch through the pad layer 122, thereby creating a tiled-stress-alleviating pad structure 122' having at least two or more tiles (e.g., 122a' and 122b') over the last level. These individual tiles may together constitute the tiled-stress-alleviating pad structure 122'. In accordance with the application, at least two adjacent tiles of the tiled-stress-alleviating pad structure 122' are uniformly spaced apart at a set distance D. As used herein, the term "uniformly spaced apart" refers to an individual tile 122a' being spaced at uniform and/or equal distance from another individual tile 122b'. As one skilled in the art will understand, the patterning of the photoresist layer (not shown) results in photoresist elements with respective openings that are sized and configured to be at a set distance which advantageously facilitates creating the desired tiles and the desired laterally spacing by distance D. In one specific example, distance "D" between two adjacent tiles of the tiled-stress-alleviating pad structure 122' may be within a range from about 1,500 nm to 2,000 nm, and ranges therebetween. In one embodiment, the tiled-stress-alleviating pad structure 122' may have an area "S" that may be substantially similar, or identical, to the area of the pad layer 122. For instance, the area of the tiled-stress-alleviating pad structure 122' may be, in one embodiment, sufficient to cover the entirety of the metal wiring 120, and extend at least partially laterally over the adjacent last level dielectric layer 114. In such an example, a tile (e.g., tile 122b') of the tiled-stress-alleviating pad structure 122' may lie over the metal wiring 120, and other tiles (e.g., tile 122a') may bridge the metal wiring 120 and dielectric layer 114, while other tiles (not labeled) may only be over the last level dielectric layer 114. In some instances, the tile area overlying the metal wiring 120 may be less than the tile area extending laterally over the adjacent last level dielectric layer 114. In one embodiment, the ratio of the portion of the tile area lying over the metal wiring 120 to the portion of the tile area extending laterally over the adjacent dielectric layer 114 may be dependent upon the area of the metal wiring 120. Still further, the thickness of each of the tiles of the tiled-stress-alleviating pad structure 122' may be substantially similar or identical to the thickness of the pad layer 122. In one example, the thickness of each of the tiles may be within a range from about 250 nm to about 3000 nm.

Figure 1D:
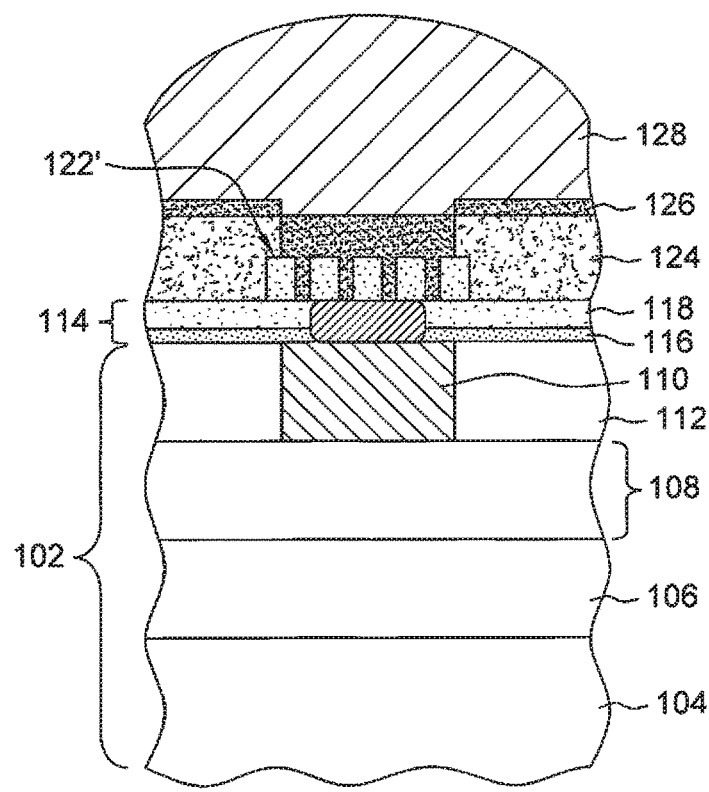
FIG. 1D depicts a resultant structure of FIG. 1C with a via, one or more BLM layers, and a solder ball disposed over the tiled-stress-alleviating pad structure, in accordance with one or more aspects of the application.

FIG. 1D depicts a resultant structure of FIG. 1C after providing passivating layer 124 over tiled-stress-alleviating pad structure 122' and preferably over last level dielectric layer 114, in accordance with one or more aspects of the application. By way of an example, the passivating layer 124, may include, or be fabricated of, a photosensitive polyimide (PSPI) material, and may be deposited by conventional deposition techniques, such as, spin-on or spraying techniques or the like. Passivation layer 124, having a thickness from about 1000 nm to about 15000 nm, may subsequently be lithographically patterned and etched to form a passivation layer via which exposes the underlying tiled-stress-alleviating pad structure 122'. Subsequent fabrication processing may proceed which, for instance, includes deposition of one or more BLM layers 125, followed by subsequent deposition of solder ball 128 over the BLM layers 126. For instance, the BLM layers 126 which, in one example, may include, or be fabricated of, one or more conformally-deposited layers, may be deposited over the passivating layer 124, and extending over the tiled-stress-alleviating pad structure 122'. These BLM layers 126, for example, may include, or be fabricated of, materials such as, for instance, TiW, CrCu, Cu or the like. The C4 plating of the solder material 128, for instance, may subsequently be deposited over the BLM layers 126, and may include, or be fabricated of, materials, such as, for instance, lead, tin, silver or the like.

The tiled-stress-alleviating pad structure 122' may be designed so as to facilitate alleviating and/or reducing the interfacial peeling stress of the pad layer 122 (see FIG. 1B), by reducing the mechanical stresses emanating by the difference in CTE between the last level dielectric layer 114 and the underlying BEOL structures 108 and 110. For instance, the effective peeling stress of the tiled-stress-alleviating pad structure may be a function of at least one physical dimension of each tile of the tiled-stress-alleviating pad structure 122'. As used herein, "function" refers to a relationship between the effective peeling stress of tiled-stress-alleviating pad structure 122' and a physical dimension such as, for example, an area of each of the tiles and/or an interior angle of each of the tiles, the thickness of each tile, as well as the total span of the tiled-stress-alleviating pad structure and the distance between two adjacent tiles (e.g., tiles 122a' and 122b') of the tiled-stress-alleviating pad structure 122'. For example, one or more different geometrical configurations of the tiled-stress-alleviating pad structure 122' may be employed to alleviate the intrinsic stress of the pad layer, depending upon, in one example, the geometry of the pad layer at issue. For instance, in one implementation (discussed below with reference to FIGS. 2A-2C), assuming the pad layer 122 has a circular-shaped geometry when viewed from top down, each of the tiles of the tiled-stress-alleviating pad structure 122' may be formed as circular-shaped tiles over the last level. Similarly, in another implementation (discussed below with reference to either FIGS. 3A-3C or FIGS. 4A-4C), assuming that the pad layer 122 has a polygon-shaped geometry (for example, a hexagonal-shaped or an octagonal-shaped) when viewed from top down, each of the tiles of the tiled-stress-alleviating pad structure 122' may be formed as polygon-shaped tiles over the last level.

Further, as presented herein, different scenarios may also have different positioning and/or layouts of the tiles and different physical dimensions of each tile, such as, size and/or an interior angle of each of the tiles, as well as the distance between two adjacent tiles, and the overall size of the tiled-stress-alleviating pad structure. These different scenarios may result in substantially lowering the effective peeling stress of the tiled-stress-alleviating pad structure relative to the interfacial peeling stress of the continuous pad layer. As used herein, the term "substantially" when used in the phrase "substantially lowers the effective peeling stress" generally refers to an effective peeling stress of the tiled-stress-alleviating pad structure being lower than the effective interfacial peeling stress of the pad layer by an order of a magnitude of about 1 MPa to about 50 MPa. Note that, as discussed above, the value of the interfacial stress reduction may be calculated, for instance, by an averaging method using the material properties of the material surrounding the tiled-stress-alleviating pad structure, the size of the chip or substrate or the like. By way of an example, each of the tiles of the tiled-stress-alleviating pad structure 122' may be designed to be positioned in either in a 2×2 array or an n×n array over the last level 114/120 and BEOL structures 110 and 108. Such configuration of two or more tiles of the tiled-stress-alleviating pad structure 122' advantageously facilitates limiting and/or confining any plausible undesirable mechanical failures that may form within a tile, with the remaining tiles facilitating reduction of the stress emanating from underlying last level dielectric layer 114 and BEOL structures 110 and 108, thereby reducing the effective peeling stress of the tiled-stress-alleviating pad structure 122'.

Additionally, as presented herein, and in one embodiment, the area of the tiled-stress-alleviating pad structure 122' may be substantially similar or identical to the area of the as deposited pad layer 122, while the area of each of the tiles present within the tiled-stress-alleviating pad structure 122' may be substantially smaller than the area of the as deposited pad layer 122. In one example, each of the tiles of the tiled-stress-alleviating pad structure 122' may have an area S' (see FIG. 2B) of about 3000 $nm^2$ to about 30000 $nm^2$, and ranges therebetween. The area S' (see FIG. 2B) of each of the tiles advantageously facilitates reducing an effective CTE mismatch between the last level dielectric layer 114 and tiled-stress-alleviating pad structure 122'. For example, the tiled-stress-alleviating pad structure 122' having smaller tiles may enhance the peeling stress reduction, relative to a tiled-stress-alleviating pad structure having larger tiles. In a specific example, an individual tile which, for instance, has an average diameter of about 8000 nm, may provide a greater reduction of stress of the tiled-stress-alleviating pad structure, than a tiled-stress-alleviating pad structure having an average diameter of about 45000 nm.

Figure 2B:
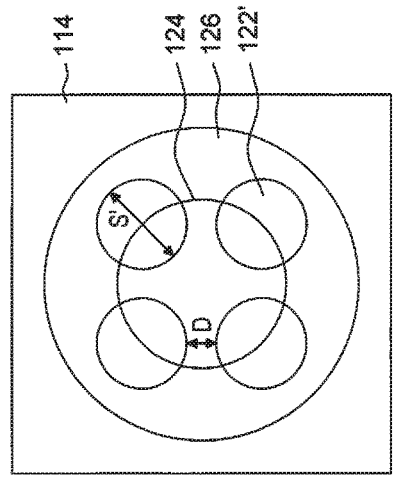
FIG. 2B depicts the structure of FIG. 2A, where each of the 2×2 arrayed tiles of the tiled-stress-alleviating pad structure disposed over the last level of the integrated circuit, in accordance with one or more aspects of the application.
Figure 2A:
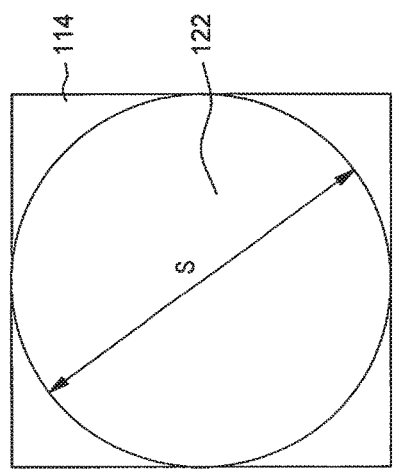
FIG. 2A is a top plan view of one embodiment of a circular pad layer disposed over the last level of the integrated circuit, in accordance with one or more aspects of the application.
Figure 2C:
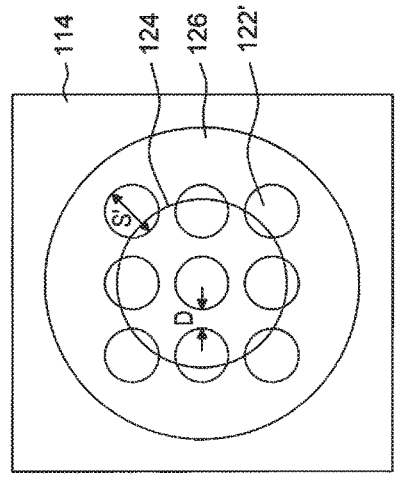
FIG. 2C depicts a variation of FIG. 2B, where the 2×2 arrayed tiles are expanded to an n×n arrayed tiled-stress-alleviating pad structure, in accordance with one or more aspects of the application.
Figure 3A:
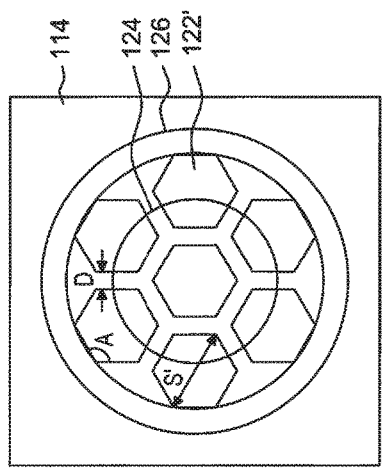
FIG. 3A is a top plan view of another embodiment of a hexagonal pad layer disposed over the last level of the integrated circuit, in accordance with one or more aspects of the application.
Figure 3B:
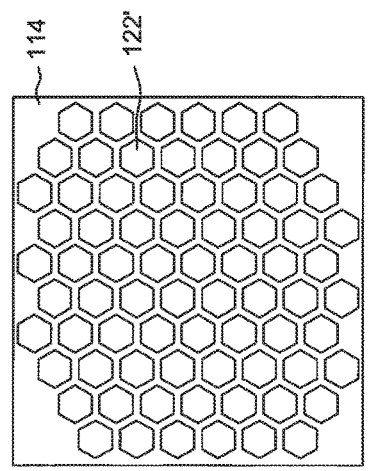
FIG. 3B depicts the structure of FIG. 3A where the tiles of the tiled-stress-alleviating pad structure are arranged in a honeycomb pattern over the last level of the integrated circuit, in accordance with one or more aspects of the application.

In an yet another implementation (discussed below with reference to FIGS. 3A-3C and/or FIGS. 4A-4C), physical dimension, such as, for instance, interior angle A (see FIG. 3B) of each of the tiles advantageously facilitates reducing the effective peeling stress of the tiled-stress-alleviating pad structure, relative to the peeling stress of the pad layer 122 (see FIGS. 1B and 3B). By way of an example, the peeling stress of the tiled-stress-alleviating pad structure 122' may be inversely proportional to an increase in the interior angle of each of the tiles. For instance, as discussed below with reference to FIGS. 2A-2C, assuming that each of the tiles of the tiled-stress-alleviating pad structure 122' has circular-shaped geometry which, for instance, does not possess any interior angle, the effective peeling stress of the tiled-stress-alleviating pad structure 122' may be lower than the peeling stress of the pad layer 122 (see FIG. 1B), by an order of a magnitude of about 8 MPa to about 40 MPa, although the range of the effective peeling stress is dependent upon several parameters such as, averaging method employed to evaluate the stress reduction, as described above. In another example, as discussed below with reference to FIGS. 3A-3C, in the case of the tile having a hexagonal-shaped geometry with an interior angle (A) of about 120°, the effective peeling stress of the tiled-stress-alleviating pad structure 122' may be lower than the peeling stress of the pad layer 122 (FIG. 1B) by a magnitude of about 30 MPa. In this example, the effective peeling stress of the tiled-stress-alleviating pad structure 122' having hexagonal-shaped tile may be higher than the effective peeling stress of the tiled-stress-alleviating pad structure 122' having a circular-shaped tile by a magnitude of about 9 MPa, although the actual reduction in the peeling stress may vary. In another example, as discussed below with reference to FIGS. 4A-4C, in the case of the tile having an octagonal-cross-sectional-shaped geometry, having an interior angle (A) of about 135°, the effective peeling stress of the tiled-stress-alleviating pad structure 122' may be lower than the interfacial peeling stress of the pad layer 122 (FIG. 1B).

The particular configuration of pad layer 122 depicted in FIG. 2A presents one embodiment of a configuration designed to facilitate reducing intrinsic stress within the resultant tiled-stress-alleviating pad structure, in accordance with one or more embodiments of the application. As discussed above in connection with FIG. 1B, the pad layer 122, having a thickness from about 250 nm to about 3,000 nm, and ranges therebetween and an exposed upper surface, is fabricated over the last level of the integrated circuit having the dielectric layer 114 and the metal wiring 120. As understood, the circular-shaped pad layer 122 reduces peeling stress emanating from the last level dielectric layer 114. Pad layer 122 may have a size, S, (for instance, an average diameter) of about 10,000 nm to about 1,00,000 nm, and ranges therebetween.

FIG. 2B and FIG. 2C depict embodiments of the structure of FIG. 2A, after the pad layer 122 (see FIG. 2A) has been patterned to provide the tiled-stress-alleviating pad structure 122', where the tiles are positioned as a 2×2 arrayed tiled-stress-alleviating pad structure, and as n×n array, respectively. In both instances, each of the tiles are formed as circular-shaped structures, based on the geometry of the pad layer 122 (see FIG. 2A), without adding unnecessary cost. These circular tiles, advantageously, facilitate in further reducing stresses such as, peeling stress and/or cracking stress, owing to an absence of sharp and/or angled geometrical corners. As depicted in FIG. 2B, each of the tiles, may have an area S' (for instance, have an average diameter) of about 3,000 $nm^2$ to about 3.00,000 $nm^2$, and ranges therebetween. As depicted, the area S', for instance, facilitates lowering the coefficient of thermal expansion, relative to that of the pad layer 122 (see FIG. 2A). This decrease in coefficient of thermal expansion advantageously facilitates reducing an effective coefficient of thermal expansion between the last level of the integrated circuit having the dielectric layer 114 and the metal wiring 120 and the tiled-stress-alleviating pad structure 122', thereby substantially lowering the effective peeling stress of the tiled-stress-alleviating pad structure 122', relative to the interfacial peeling stress of pad layer 122, as discussed above in connection with FIG. 2A. As presented, these tiles may be uniformly spaced apart at a set distance, D, of about 500 nm to about 5,000 nm. The effective peeling stress of the 2×2 arrayed tiled-stress-alleviating pad structure 122', may be uniformly distributed across the tiled-stress-alleviating pad structure 122' as a compressive stress. Note that, in this example, the effective peeling stress of the 2×2 arrayed tiled-stress-alleviating pad structure 122' may be compressive, owing to various factors such as, total span of the tiled-stress-alleviating pad structure is lower than the total span of the pad layer 122 (see FIG. 2A), and the non-existent interior angle (for instance, of the circular tiles). Further, the effective peeling stress of the 2×2 arrayed tiled-stress-alleviating pad structure 122' may also be compressive stress, due to the reduction of the CTE mismatch between the tiled-stress-alleviating pad structure and the other components of the 3-D stacked die.

Further, as depicted in FIG. 2C, the area, S', of each of the tiles may be further reduced, upon being expanded to form an n×n arrayed tiled-stress-alleviating pad structure 122'. In a specific example, the area, S', of each of the tiles may be within a range of about 6,000 $nm^2$ to about 8,000 $nm^2$, and may be uniformly spaced apart at a set distance, D, of about 1,500 nm to about 2,000 nm. In this example, the effective peeling stress of the tiled-stress-alleviating pad structure 122', for instance, may be within a range of about −300 MPa to about 8 MPa, and the peeling stress may be non-uniformly distributed across the tiled-stress-alleviating pad structure 122' from a tensile stress to a compressive stress. Note that, in this example, the effective peeling stress of the n×n arrayed tiled-stress-alleviating pad structure 122' is higher than the effective peeling stress of the 2×2 arrayed tiled-stress-alleviating pad structure 122', due to the expanded surface area occupied by the tiles. Further, the tiled-stress-alleviating pad structure may be disposed in a spaced relation a certain distance from the overlying passivating layer 124 (in particular, the via in the passivating layer) and the BLM layers 126, with the tiled-stress-alleviating pad structure being centered within the overlying via of passivating layer 124 and the BLM layers 126, as depicted in FIG. 2C. Specifically, the edge of the via in the passivating layer 124 is pointed to. As can be seen, in FIG. 2B, each of the tiles bridges passivating via opening such that a portion of each tile is exposed to the BLM layers 126 and a portion of each tile is covered by passivating layer 124. However, in the FIG. 2C embodiment, some tiles are completely exposed by the via to contact the BLM layers 126, while the other tiles bridge. While not shown, it is also contemplated that still more tiles may be completely covered by passivating layer 124.

FIG. 3A is a top plan view of another embodiment of a hexagonal pad layer disposed over the through-substrate via structure, in accordance with one or more aspects of the application. By way of an example, as discussed above in connection with FIG. 1B, the pad layer 122, having a thickness of about 500 nm to about 3,000 nm, and ranges therebetween and an exposed upper surface, has been embedded within the last level dielectric layer 114 and the metal wiring 120 or is over the last level dielectric layer 114. Pad layer 122 may have an area, S, (for instance, an average diameter) of about 10,000 $nm^2$ to about 1,00,000 $nm^2$, and ranges therebetween. In this embodiment, the interfacial peeling stress of the hexagonal-shaped pad layer 122 may be higher than the interfacial peeling stress of the circular-shaped pad layer, owing to angled geometrical corners with an interior angle of about 120° which, for instance, may enhance the concentration of the stress at the corners thereof.

Figure 3C:
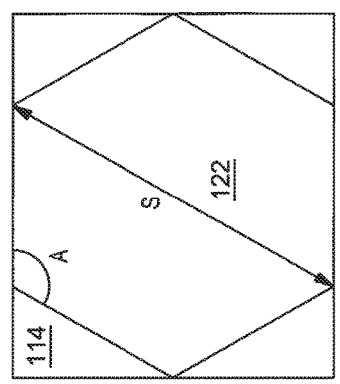
FIG. 3C depicts a variation of FIG. 3B, where the honeycomb pattern of tiled-stress-alleviating pad structure is expanded to n×n+1×n arrayed tiled-stress-alleviating pad structure, in accordance with one or more aspects of the application.

FIG. 3B and FIG. 3C depicts embodiments of the structure of FIG. 3A after the pad layer 122 (see FIG. 1B) has been patterned to provide the tiled-stress-alleviating pad structure 122' where the tiles are arrayed in a honeycomb pattern, and in a n×n+1×n arrayed pattern. In both instances, each of the tiles are formed as hexagonal-shaped structures with an interior angle of about 120°, based on the geometry of the pad layer, without adding unnecessary cost. As depicted in FIG. 3B, each of the tiles, may have an area, S', (for instance, have an average diameter) of about 3,000 $nm^2$ to about 30,000 $nm^2$, and ranges therebetween, and may be uniformly spaced apart at a set distance, D, of about 500 nm to about 5,000 nm, and ranges therebetween. In this example, although the effective peeling stress of tiled-stress-alleviating pad structure may be within a range of about −340 MPa to about −13 MPa, owing to the angled geometrical corners, the peeling stress may be higher than the effective peeling stress of a circular-shaped tiled-stress-alleviating pad structure described in connection with FIGS. 2A-2C. Note that, as depicted, the peeling stress may be non-uniformly distributed across the tiled-stress-alleviating pad structure 122' as a combination of tensile stress and compressive stress. Further, the tiled-stress-alleviating pad structure may be disposed in a spaced relation a certain distance from the overlying via 124 and the BLM layers 126, with the tiled-stress-alleviating pad structure being centered within the overlying passivating via structure 124 and the BLM layers 126, as depicted in FIG. 3B. Further, as depicted in FIG. 3C, the area, S', of each of the tiles may be within a range of about 3,000 nm$^2$ to about 30,000 nm$^2$, and may be uniformly spaced apart at a set distance, D, of about 500 nm to about 5,000 nm.

Figure 4B:
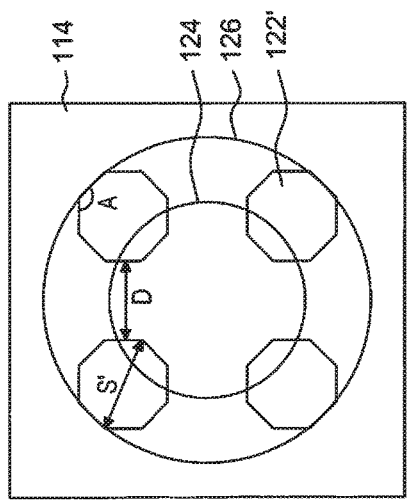
FIG. 4B depicts the structure of FIG. 4A, after the pad layer has been patterned to a 2×2 arrayed tiled-stress-alleviating pad structure over the last level of the integrated circuit, in accordance with one or more aspects of the application.
Figure 4A:
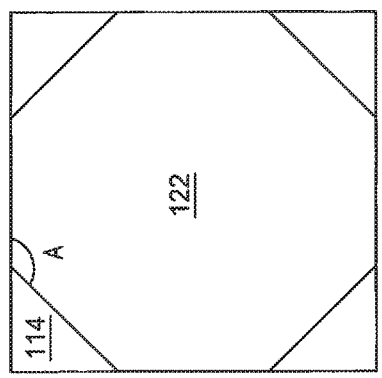
FIG. 4A is a top plan view of another embodiment of an octagonal pad layer disposed over the last level of the integrated circuit, in accordance with one or more aspects of the application.

FIG. 4A is a top plan view of another embodiment of an octagonal pad layer disposed over the last level of the integrated circuit having the dielectric layer 114 and the metal wiring 120, in accordance with one or more aspects of the application. By way of an example, as discussed above in connection with FIG. 1B, the pad layer 122, having a thickness of about 250 nm to about 3,000 nm and an exposed upper surface, has been provided over the last level. Pad layer 122 may have an area, S, (for instance, an average diameter) of about 10,000 nm$^2$ to about 1,00,000 nm$^2$. As discussed above in connection with FIG. 3B, the interfacial peeling stress of the octagonal-shaped pad layer 122 may be higher than the interfacial peeling stress of the circular-shaped pad layer, owing to angled geometrical corners with an interior angle of about 135° which, for instance, may enhance the concentration of the stress at the corners thereof.

Figure 4C:
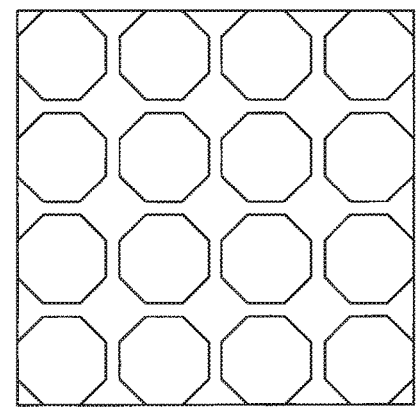
FIG. 4C depicts a variation of FIG. 4B, where the 2×2 arrayed stress-alleviated pad portions are expanded to an n×n arrayed tiled-stress-alleviating pad structure, in accordance with one or more aspects of the application.

FIG. 4B and FIG. 4C depicts embodiments of the structure of FIG. 4A, after the pad layer (see FIG. 1B) has been patterned to provide the tiled-stress-alleviating pad structure, with the tile being positioned as 2×2 arrayed tiled-stress-alleviating pad structure, and as n×n arrayed tiled-stress-alleviating pad structure, respectively. In both instances, each of the tiles are formed as octagonal-shaped structures with an interior angle of about 135°, based on the geometry of the pad layer, without adding unnecessary cost. As depicted in FIG. 4B, each of the tiles, may have an area, S', (for instance, have an average diameter) of about 3,000 nm$^2$ to about 30,000 nm$^2$, and may be uniformly spaced apart at a set distance, D, of about 500 nm to about 5,000 nm. In this example, owing to the angled geometrical corners, although the effective peeling stress of tiled-stress-alleviating pad structure may be higher than the effective peeling stress of a circular-shaped tiled-stress-alleviating pad structure described in connection with FIGS. 2A-2C. Further, as depicted in FIG. 4C, the area, S', of each of the tiles may be within a range of about 3,000 nm$^2$ to about 30,000 nm$^2$, and may be uniformly spaced apart at a set distance, D, of about 500 nm to about 5,000 nm.

The terminology used herein is for the purpose of describing particular embodiments only and is not intended to be limiting of the application. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including'), and "contain" (and any form of contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the application has been presented for purposes of illustration and description, but is not intended to be exhaustive or limited to the application in the form disclosed. Many modifications and variations will be apparent to those of ordinary skill in the art without departing from the scope and spirit of the application. The embodiment was chosen and described in order to best explain the principles of one or more aspects of the application and the practical application, and to enable others of ordinary skill in the art to understand one or more aspects of the application for various embodiments with various modifications as are suited to the particular use contemplated.

What is claimed is:

1. A semiconductor device comprising: a tiled-stress-alleviating pad structure in contact with a last level of an integrated circuit having a dielectric layer and a metal wiring, the last level is located on a substrate structure, wherein the tiled-stress-alleviating pad structure comprises a plurality of tiles, the plurality of the tiles of the tiled-stress-alleviating pad structure having a set geometry and a set distance between immediately adjacent tiles, and are uniformly spaced apart from each other by the set distance,
wherein the tiled-stress-alleviating pad structure comprises a first set of tiles and a second set of tiles, the first set of tiles overlying a last level metal wiring, and the second set of tiles extending laterally over a last level dielectric layer and the last level metal wiring, and wherein an area of the second set of tiles is less than an area of the first set of tiles.

2. The semiconductor device of claim 1, wherein the set geometry comprises at least one of a circle and a polygon, and wherein the plurality of tiles is in an array.

3. The semiconductor device of claim 2, wherein the set geometry is a hexagonal-shape, and the array forms a honeycomb pattern.

4. The semiconductor device of claim 2, wherein the set geometry is a circular-shape, and the array is at least one of a 2×2 array and an n×n array.

5. The semiconductor device of claim 1, wherein the set distance is within a range from about 1,500 nm to about 2,000 nm.

6. The semiconductor device of claim 1, wherein the area of each tile of the plurality of tiles is within a range of about 3,000 nm$^2$ to about 30,000 nm$^2$.

7. The semiconductor device of claim 1, further comprising passivating layer via and a ball-limiting metallurgy (BLM) layer disposed over the tiled-stress-alleviating pad structure.

8. The semiconductor device of claim 7, wherein the tiled-stress-alleviating pad structure is centered within the passivating layer via.

9. A semiconductor device comprising:
a tiled-stress-alleviating pad structure in contact with a last level of an integrated circuit having a dielectric layer and a metal wiring, the last level is located on a substrate structure, wherein the tiled-stress-alleviating pad structure comprises a plurality of tiles, the plurality of the tiles of the tiled-stress-alleviating pad structure having a set geometry and a set distance of from about 1,500 nm to about 2,000 nm between immediately adjacent tiles, and are uniformly spaced apart from each other by the set distance.

10. A semiconductor device comprising:

a tiled-stress-alleviating pad structure in contact with a last level of an integrated circuit having a dielectric layer and a metal wiring, the last level is located on a substrate structure, wherein the tiled-stress-alleviating pad structure comprises a plurality of tiles, the plurality of the tiles of the tiled-stress-alleviating pad structure having a set geometry and a set distance between immediately adjacent tiles, and are uniformly spaced apart from each other by the set distance, wherein the area of each tile of the plurality of tiles is within a range of about 3,000 $nm^2$ to about 30,000 $nm^2$.

* * * * *